(12) United States Patent
Wu et al.

(10) Patent No.: US 11,322,628 B2
(45) Date of Patent: May 3, 2022

(54) OPTICAL MEMBER DRIVING MECHANISM

(71) Applicant: TDK TAIWAN CORP., Taoyuan (TW)

(72) Inventors: Fu-Yuan Wu, Taoyuan (TW); Sheng-Zong Chen, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 183 days.

(21) Appl. No.: 16/745,951

(22) Filed: Jan. 17, 2020

(65) Prior Publication Data

US 2020/0333558 A1 Oct. 22, 2020

Related U.S. Application Data

(60) Provisional application No. 62/836,405, filed on Apr. 19, 2019.

(30) Foreign Application Priority Data

Dec. 20, 2019 (EP) .................................. 19218896

(51) Int. Cl.
*G02B 7/182* (2021.01)
*H01L 31/0232* (2014.01)
(Continued)

(52) U.S. Cl.
CPC ........ *H01L 31/02327* (2013.01); *G02B 7/003* (2013.01); *G02B 7/09* (2013.01);
(Continued)

(58) Field of Classification Search
CPC ......... H01L 31/02327; H01L 27/14618; H01L 27/14636; H01L 31/02002; H01L 31/022466; H01L 31/024; H01L 31/1136; H01L 31/02366; H01L 31/02016; H01L 24/48; H01L 2224/48091; H01L 2224/48106; H01L 2224/48225; H01L 24/24; H01L 2224/24225; H01L 2924/181; H01L 2224/16235; H01L 24/16; H01L 2224/48227; H01L 2924/16152; H01L 2924/16195; H01L 2924/00014; H01L 2224/16225; H01L 2924/19105; H01L 27/14625; G02B 7/003; G02B 7/09; G02B 27/646; G02B 7/1821; G02B 13/0045;
(Continued)

(56) References Cited

U.S. PATENT DOCUMENTS

2007/0024549 A1* 2/2007 Choi .................... B81B 7/0067
345/84
2016/0105090 A1* 4/2016 Sadaharu ........... G02B 26/0841
310/38

FOREIGN PATENT DOCUMENTS

CN 209858825 U 12/2019

OTHER PUBLICATIONS

Office Action issued in corresponding CN application No. 202020240172.7 dated Aug. 5, 2020.

* cited by examiner

*Primary Examiner* — Euncha P Cherry
(74) *Attorney, Agent, or Firm* — Muncy, Geissler, Olds & Lowe, P.C.

(57) ABSTRACT

An optical member driving mechanism is provided, including a movable portion, a fixed portion, and a driving assembly. The movable portion is connected to an optical member. The movable portion is movable relative to the fixed portion. The driving assembly is configured to drive the movable portion to move relative to the fixed portion.

15 Claims, 15 Drawing Sheets

(51) Int. Cl.
*H01L 31/113* (2006.01)
*H01L 31/0236* (2006.01)
*H01L 31/02* (2006.01)
*H01L 27/146* (2006.01)
*H01L 31/0224* (2006.01)
*H01L 31/024* (2014.01)
*G03B 5/00* (2021.01)
*H04N 5/225* (2006.01)
*G03B 5/02* (2021.01)
*G03B 5/04* (2021.01)
*H02K 11/21* (2016.01)
*G02B 7/09* (2021.01)
*G02B 27/64* (2006.01)
*G03B 13/36* (2021.01)
*H02K 41/035* (2006.01)
*G02B 7/00* (2021.01)
*H01L 23/00* (2006.01)
*G02B 13/00* (2006.01)

(52) U.S. Cl.
CPC ......... *G02B 7/1821* (2013.01); *G02B 27/646* (2013.01); *G03B 5/00* (2013.01); *G03B 5/02* (2013.01); *G03B 5/04* (2013.01); *G03B 13/36* (2013.01); *H01L 27/14618* (2013.01); *H01L 27/14636* (2013.01); *H01L 31/02002* (2013.01); *H01L 31/024* (2013.01); *H01L 31/02016* (2013.01); *H01L 31/02366* (2013.01); *H01L 31/022466* (2013.01); *H01L 31/1136* (2013.01); *H02K 11/21* (2016.01); *H02K 41/0356* (2013.01); *H04N 5/2253* (2013.01); *H04N 5/2254* (2013.01); *H04N 5/2257* (2013.01); *G02B 13/0045* (2013.01); *G03B 2205/0007* (2013.01); *G03B 2205/0069* (2013.01); *H01L 24/48* (2013.01); *H01L 2224/48091* (2013.01); *H01L 2224/48106* (2013.01); *H01L 2224/48225* (2013.01)

(58) Field of Classification Search
CPC .. H04N 5/2257; H04N 5/2253; H04N 5/2254; H02K 11/21; H02K 41/0356; G03B 13/36; G03B 5/02; G03B 5/04; G03B 5/00; G03B 2205/0007; G03B 2205/0069
USPC ........................................................ 359/876
See application file for complete search history.

OPTICAL MEMBER DRIVING MECHANISM

CROSS REFERENCE TO RELATED APPLICATIONS

The present application claims priority to U.S. Provisional Patent Applications No. 62/836,405, filed in Apr. 19, 2019, and Europe Patent Applications No. 19218896.9, filed on Dec. 20, 2019, which are incorporated by reference herein in their entirety.

BACKGROUND OF THE INVENTION

Field of the Invention

The application relates in general to an optical member driving mechanism, and in particular, to an optical member driving mechanism configured to drive an optical member to rotate.

Description of the Related Art

Thanks to technological advancements, the latest consumer electronic devices (such as tablet computers and smartphones) now usually include a lens module capable of aiding in photography or recording video. These electronic devices have become commonplace, and have been developed to be more convenient and thin. More and more choices are available for users to choose from. However, when a lens with long focal length is disposed in the electronic device, the thickness of the electronic device is increased, and as such it is hard to make the electronic device thin.

BRIEF SUMMARY OF INVENTION

To address the deficiencies of conventional products, an embodiment of the invention provides an optical member driving mechanism, including a movable portion, a fixed portion, and a driving assembly. The movable portion is connected to an optical member. The movable portion is movable relative to the fixed portion. The driving assembly is configured to drive the movable portion to move relative to the fixed portion.

In some embodiments, the optical member is configured to adjust the emission direction of light from an incident direction to an outgoing direction, and the driving assembly is configured to drive the movable portion to rotate around a rotation axis relative to the fixed portion.

In some embodiments, the rotation axis does not pass through the turning point of the light. The optical member driving mechanism further comprises an elastic member, and the movable portion is movably connected to the fixed portion by the elastic member.

In some embodiments, the optical member driving mechanism has a first side and a second side, the movable portion is disposed between the first side and the second side, and the elastic member extends from the first side to the second side. The elastic member has a plate structure, and the extending direction of the elastic member is perpendicular or parallel to the incident direction.

In some embodiments, the elastic member comprises a first engaged section, a second engaged section, a first curved section, a second curved section, and an axis section. The first engaged section is connected to the fixed portion. The second engaged section is connected to the movable portion. The first curved section is connected to the first engaged section. The second curved section is connected to the second engaged section. The axis section is connected to the first curved section and the second curved section. At least a portion of the first engaged section and the second engaged section overlap as seen from the outgoing direction.

In some embodiments, the optical member driving mechanism further comprises a plurality of damping members, configured to suppress the vibration of the movable portion relative to the fixed portion and disposed on the fixed portion, the movable portion or the elastic member. The optical member driving mechanism has a polygonal structure, and the damping members are disposed on the different corners as seen from the outgoing direction as seen from the incident direction or the outgoing direction. The damping members are disposed on a virtual plane, and the virtual plane is perpendicular or parallel to the incident direction.

In some embodiments, a gap is formed between the optical member and the movable portion.

In some embodiments, the driving assembly comprises a first electromagnetic driving member and a second electromagnetic driving member, respectively disposed on the fixed portion and the movable portion.

In some embodiments, the driving assembly further comprises a magnetic permeability member, disposed on the movable portion and between the second electromagnetic driving member and the movable portion. The magnetic permeability member has at least one extending portion that extends through the movable portion.

In some embodiments, the driving assembly further comprises a plurality of wires and a position sensor. The wires are embedded in the fixed portion, and the position sensor is connected to connecting portions of the wires. The connecting portions of the wires are symmetric relative to the position sensor.

In some embodiments, the fixed portion comprises a base and a housing, the movable portion is disposed between the base and the housing. The base has a protrusion, a bottom and a lateral wall. The housing has a hole. The bottom has an overflow groove. The lateral wall is connected to the bottom and has a glue recess communicated with the overflow groove. When the base is joined to the housing, the protrusion passes through the hole, the glue recess is disposed between the base and the housing, and the overflow groove is exposed.

In some embodiments, the optical member driving mechanism further comprises a plurality of wires embedded in the base, and the base comprises a plurality of through holes. At least a portion of the wires is exposed from the through hole. The wires can include at least one interrupt region, and the interrupt region is exposed from the through hole.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the optical member driving mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
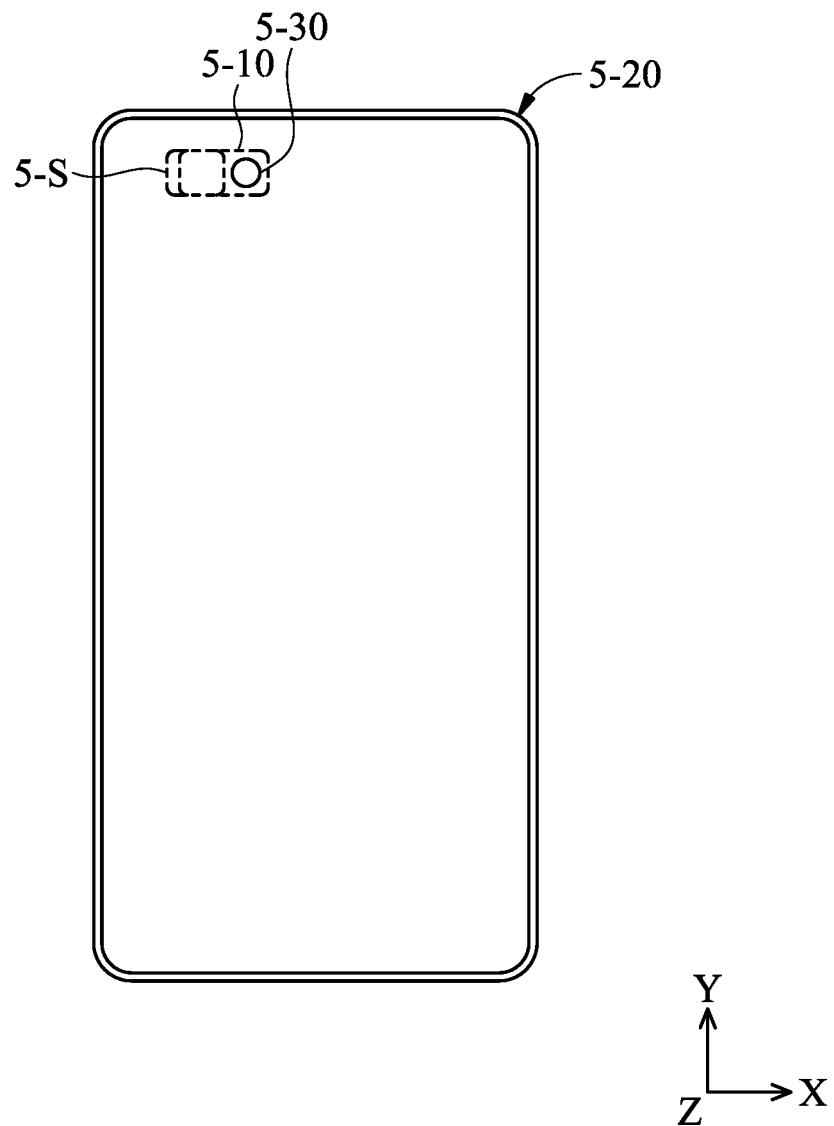
FIG. 1 is a schematic diagram of an electronic device according to an embodiment of the invention.
Figure 2:
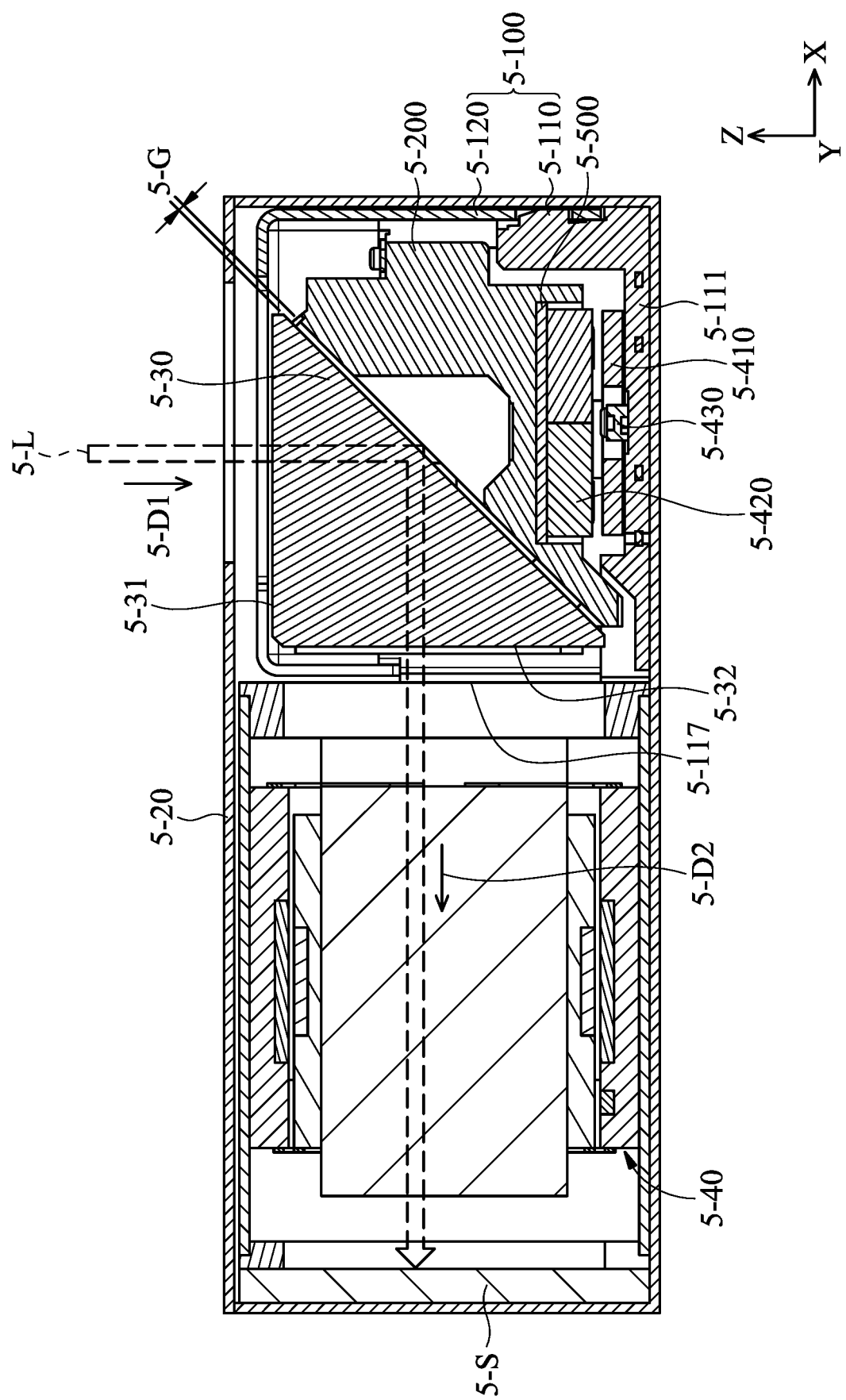
FIG. 2 is a partial cross-sectional view of the electronic device according to an embodiment of the invention.

Referring to FIGS. 1 and 2, in an embodiment of the invention, an optical member driving mechanism 5-10 can be disposed in an electronic device 5-20. The optical member driving mechanism 5-10 is configured to hold an optical member 5-30 and drive the optical member 5-30 to move relative to an image sensor module 5-S in the electronic device 5-20, so as to achieve the purpose of focus adjustment. For example, the electronic device 5-20 can be a digital camera or a smart phone having the function of capturing photographs or making video recordings, and the optical member 5-30 can be a prism or a mirror. When capturing photographs or making video recordings, light 5-L enters the optical member driving mechanism 5-10 along an incident direction 5-D1, and moves along an outgoing direction 5-D2 to reach the image sensor module 5-S after reflected by the optical member 5-30.

In this embodiment, after reflected by the optical member 5-30, the light 5-L reaches the image sensor module 5-S through an optical system 5-40. The optical system 5-40 can be adjusted or omitted as required, and is not limited to the structure shown in figures. It should be noted that, in this embodiment, the light 5-L enters the optical member 5-30 from a first surface 5-31 of the optical member 5-30, and leaves the optical member 5-30 from a second surface 5-32. In some embodiments, the disposing orientation of the optical member driving mechanism 5-10 can be adjusted, the light 5-L can enter the optical member 5-30 from the second surface 5-32 of the optical member 5-30 and leave the optical member 5-30 from the first surface 5-31. In other words, in some embodiments, the incident direction 5-D1 and the outgoing direction 5-D2 can be exchanged.

Figure 3:
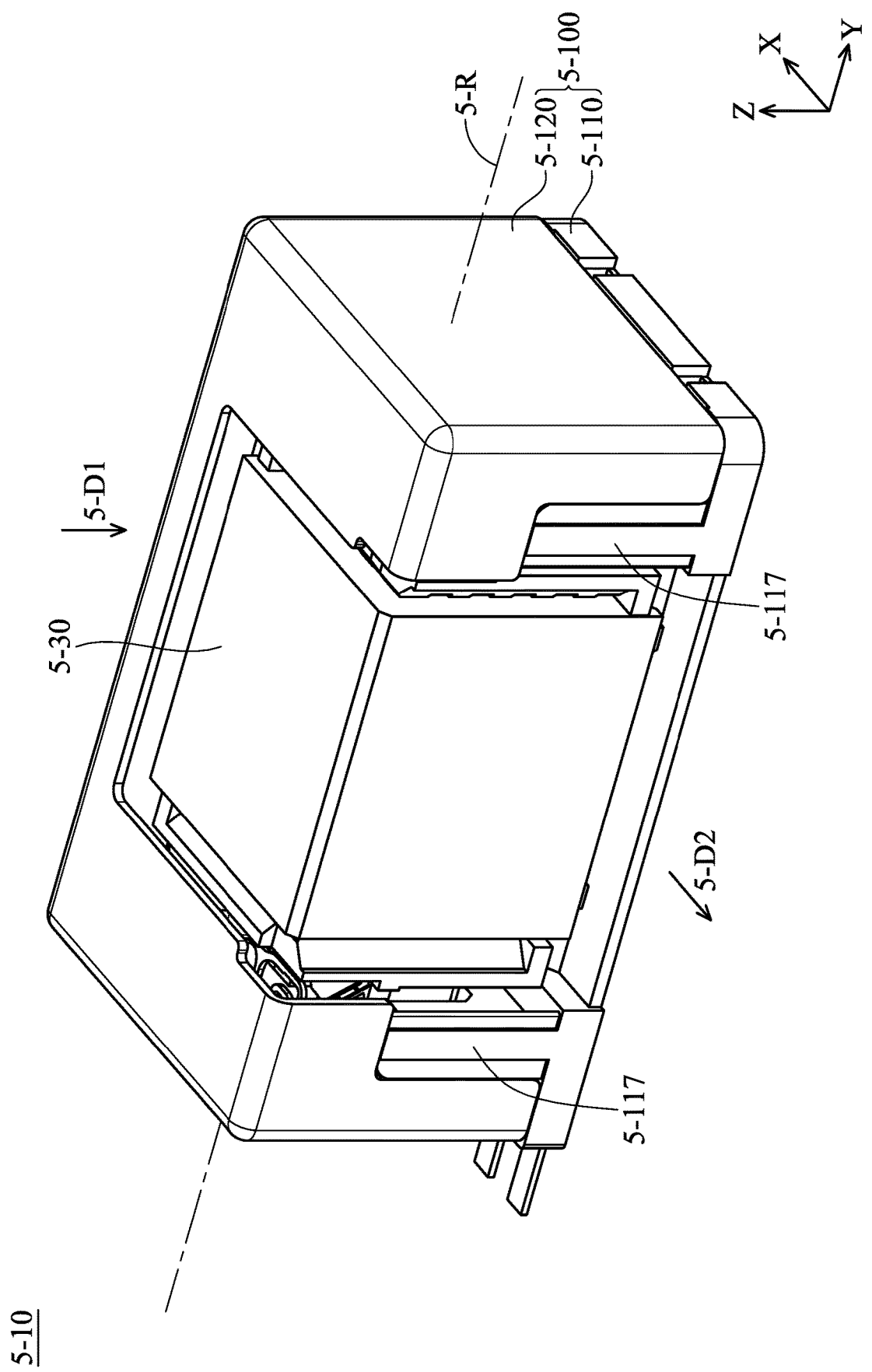
FIG. 3 is a schematic diagram of an optical member driving mechanism according to an embodiment of the invention.
Figure 4:
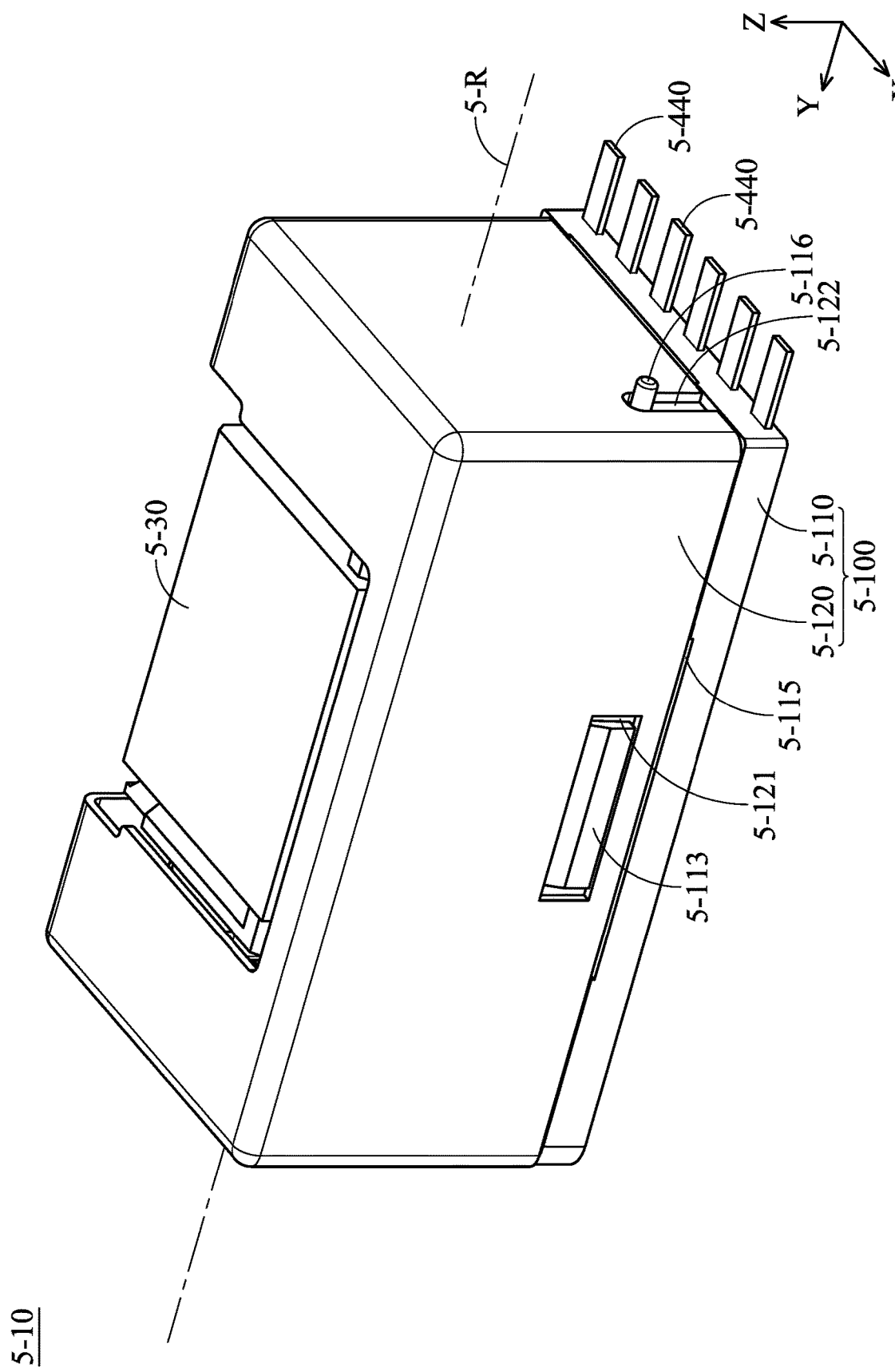
FIG. 4 is a schematic diagram of an optical member driving mechanism in another view according to an embodiment of the invention.
Figure 5:
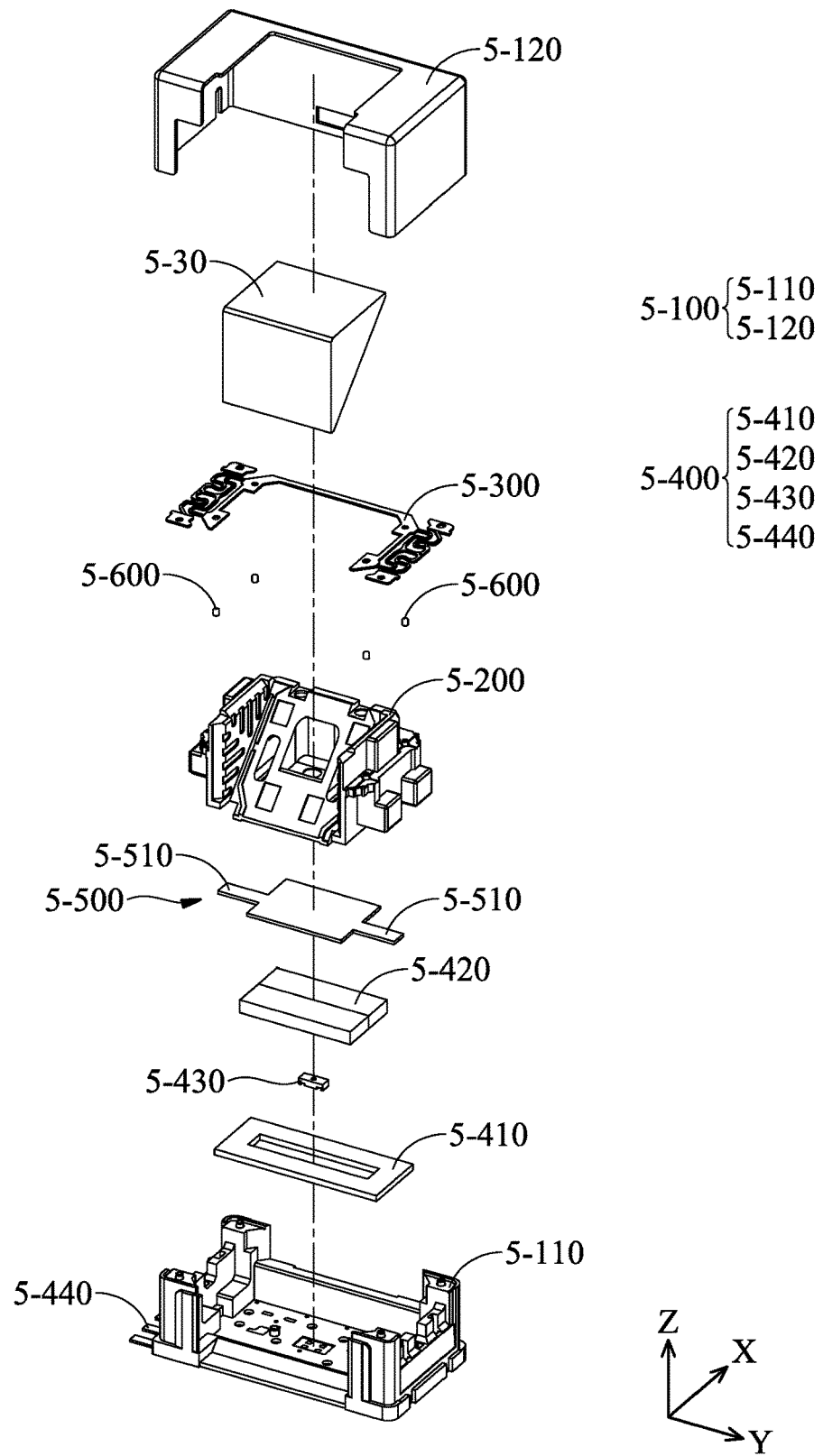
FIG. 5 is an exploded-view diagram of the optical member driving mechanism according to an embodiment of the invention.

FIGS. 3 and 4 are schematic diagrams of the optical member driving mechanism 5-10 in different views, and FIG. 5 is an exploded-view diagram of the optical member driving mechanism 5-10. As shown in FIGS. 3-5, the optical member driving mechanism 5-10 primarily includes a fixed portion 5-100, a movable portion 5-200, an elastic member 5-300, a driving assembly 5-400, at least one magnetic permeability member 5-500, and a plurality of damping members 5-600.

Figure 6:
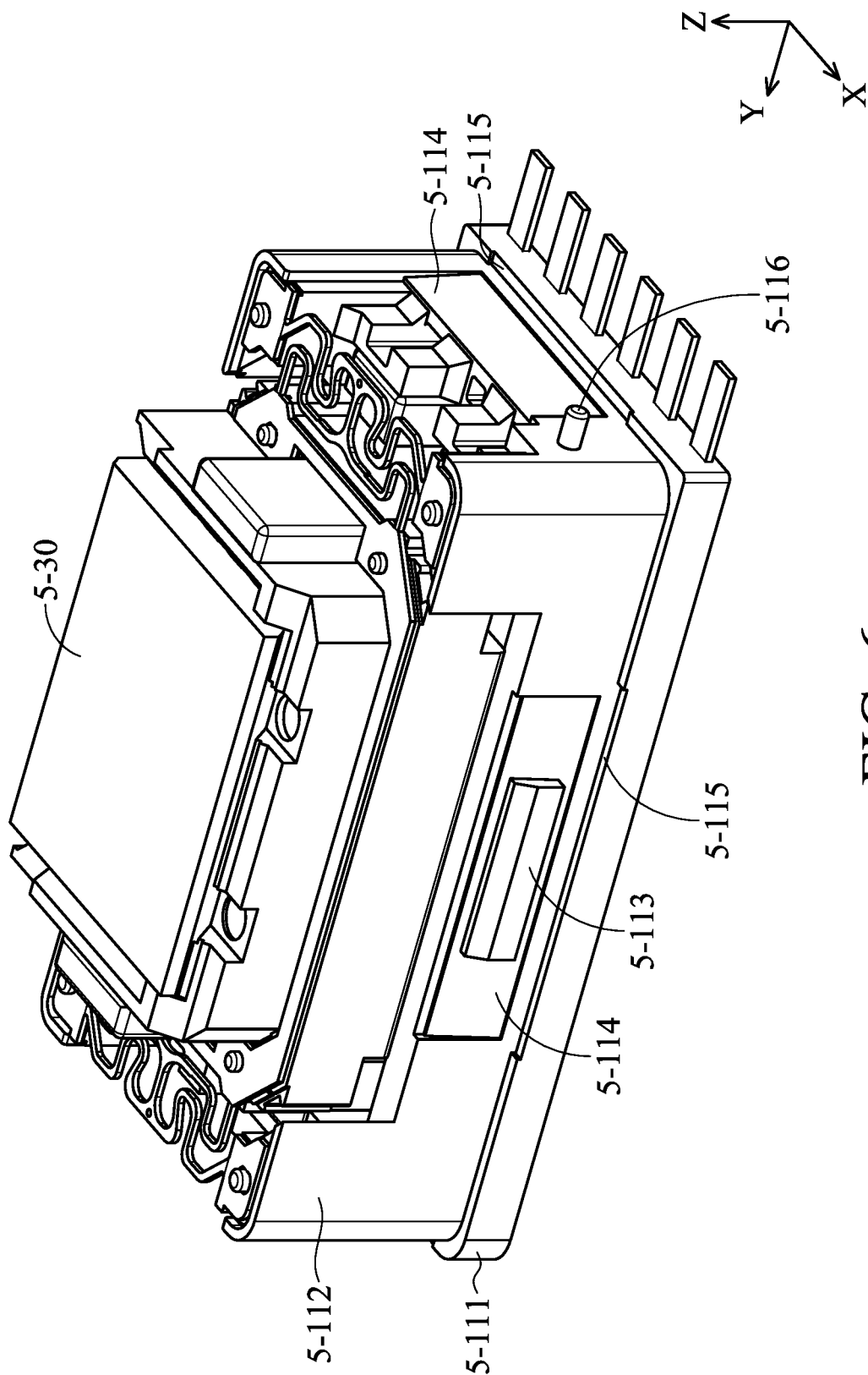
FIG. 6 is a schematic diagram of the optical member driving mechanism according to an embodiment of the invention, wherein the housing is omitted.

The fixed portion 5-100 includes a base 5-110 and a housing 5-120. The base 5-110 and the housing 5-120 can be assembled using snap-fit joints or adhesive member. In detail, as shown in FIGS. 4 and 6, the housing 5-120 has a hole 5-121, and the base 5-110 has a bottom 5-111 and a lateral wall 5-112. The lateral wall 5-112 is connected to the bottom 5-111 and extends along the Z-axis. A protrusion 5-113 and at least one glue recess 5-114 are formed on the lateral wall 5-112, and at least one overflow groove 5-115 communicated with the glue recess is formed on the bottom 5-111, wherein the glue recess 5-114 has an inclined surface. In other words, the portion of the glue recess 5-114 away from the bottom 5-111 is closer to the movable portion 5-200.

When the user desires to join the base 5-110 to the housing 5-120, a glue can be applied in the glue recess 5-114, and then the housing 5-120 can approach the bottom 5-111 of the base 5-111 along -Z-axis. Finally, the protrusion 5-113 can pass through the hole 5-121 (as shown in FIG. 4). Owing to adhesion of the glue and the snap-fit joints between the protrusion 5-113 and the hole 5-121, the base 5-110 and the housing 5-120 can be tightly joined together.

If the glue is redundant, the glue slides along the inclined surface of the glue recess 5-114 to the overflow groove 5-115 during joining. As shown in FIG. 4, when the base 5-110 and the housing 5-120 are joined, the glue recess 5-114 is disposed between the base 5-110 and the housing 5-120, and the overflow groove 5-115 is exposed. Since the overflow groove 5-115 is exposed, the redundant glue can be exhausted and will not remain in the optical member driving mechanism 5-10.

Moreover, in order to ensure that the user assembles the base 5-110 and the housing 5-120 correctly, the base 5-110 has a positioning member 5-116 that protrudes from the lateral wall 5-112, and the housing 5-120 has a positioning slot 5-122 that corresponds to the positioning member 5-116. When the base 5-110 is joined to the housing 5-120, the positioning member 5-116 enters the positioning slot 5-122.

As shown in FIGS. 2 and 3, in this embodiment, the base 5-110 has a plurality of abutting members 5-117 protruding from the lateral wall 5-112 and facing the optical system 5-40. The surfaces of these abutting members 5-117 facing the optical system 5-40 are coplanar, so that the optical member driving mechanism 5-10 can horizontally attach the optical system 5-40.

Figure 7:
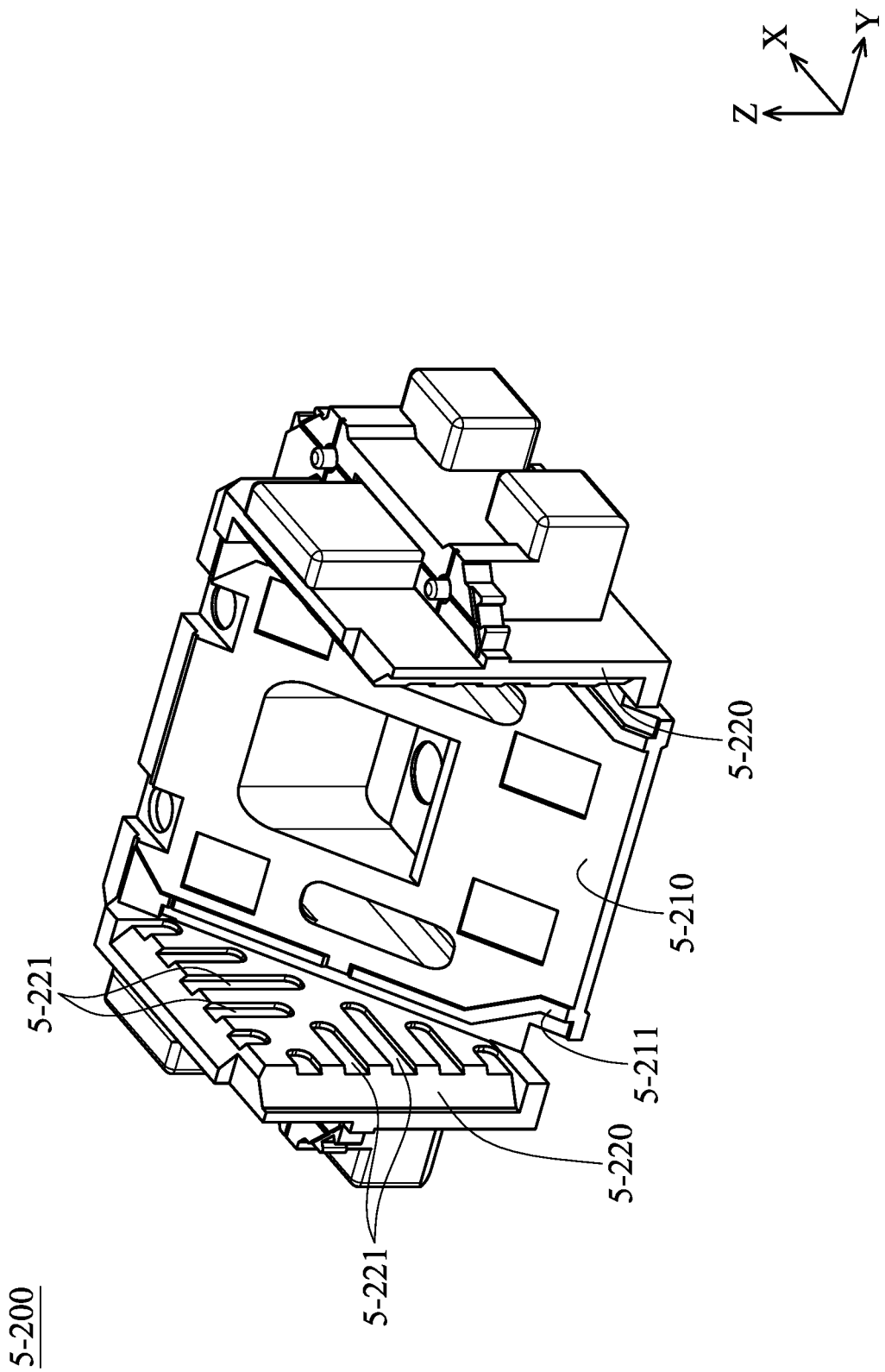
FIG. 7 is a schematic diagram of a movable portion according to an embodiment of the invention.

As shown in FIGS. 5 and 7, the movable portion 5-200 is an optical member holder, and the optical member 5-30 is disposed on a surface 5-210 of the movable portion 5-200. Since at least one supporting portion 5-211 protruding from the surface 5-210 is formed on the peripheral area of the surface 5-210 in this embodiment, a gap 5-G can be formed between the optical member 5-30 and the surface 5-210 when the optical member 5-30 is disposed on the movable portion 5-200 (as shown in FIG. 2). Therefore, the efficiency of reflecting can be enhanced, and the disposing angle of the optical member 5-30 can be adjusted.

The optical member 5-30 can be affixed to the movable portion 5-200 by using an adhesive member. For example, a plurality of grooves 5-221 are formed on the inner surface of the lateral wall 5-220 of the movable portion 5-200. When the optical member 5-30 is disposed on the supporting portion 5-211, the user can infuse glue into the grooves 5-221, so that the optical member 5-30 can be affixed to the movable portion 5-200 from its lateral surfaces.

Figure 8:
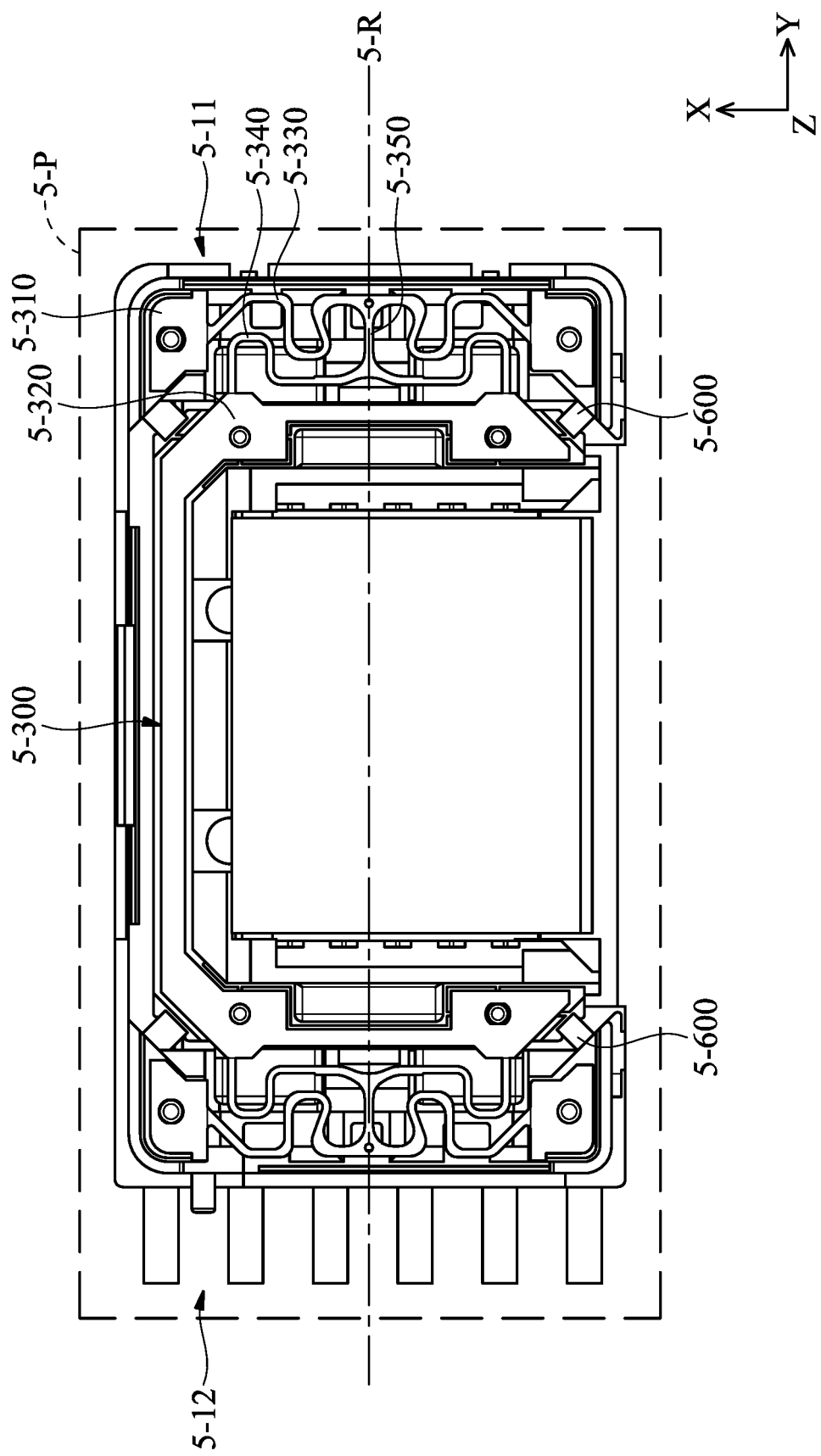
FIG. 8 is a top view of the optical member driving mechanism according to an embodiment of the invention, wherein the housing is omitted.

Referring to FIGS. 5 and 8, the elastic member 5-300 has at least one first engaged section 5-310, at least one second engaged section 5-320, at least one first curved section 5-330, at least one second curved section 5-340, and at least one axis section 5-350. The first engaged section 5-310 is affixed to the fixed portion 5-100, and the second engaged section 5-320 is affixed to the movable portion 5-200. The first curved section 5-330, the second curved section 5-340, and the axis section 5-350 are disposed between the first engaged section 5-310 and the second engaged section 5-320. The first curved section 5-330 connects the first engaged section 5-310 to the axis section 5-350, and the second curved section 5-340 connects the second engaged section 5-320 to the axis section 5-350. The movable portion 5-200 can be suspended on the fixed portion 5-100 by the elastic member 5-300.

It should be noted that, in this embodiment, the optical member driving mechanism 5-10 has a first side 5-11 and a second side 5-12, and the movable portion 5-200 is disposed between the first side 5-11 and the second side 5-12. The elastic member 5-300 has a plate structure and extends from the first side 5-11 to the second side 5-12. The extending direction of the elastic member 5-300 is perpendicular to the incident direction 5-D1 of the light 5-L. At least a portion of the first curved section 5-330 and the second curved section 5-340 overlap as seen from the outgoing direction 5-D2, so as to effectively distribute the stress during the rotation of the movable portion 5-200.

Referring to FIGS. 2, 5 and 8, the driving assembly 5-400 includes at least one first electromagnetic driving member 5-410, at least one second electromagnetic driving member 5-420, a position sensor 5-430, and a plurality of wires 5-440. The first electromagnetic driving member 5-410 and the second electromagnetic driving member 5-420 are respectively affixed to the fixed portion 5-100 and the movable portion 5-200, and the position of the first electromagnetic driving member 5-410 corresponds to the position of the second electromagnetic driving member 5-420. In this embodiment, the first electromagnetic driving member 5-410 is a coil, and the second electromagnetic driving member 5-420 is a magnet. When current flows through the first electromagnetic driving member 5-410, an electromagnetic effect is generated between the first electromagnetic driving member 5-410 and the second electromagnetic driving member 5-420, and the movable portion 5-200 and the optical member 5-30 disposed on the movable portion 5-200 are driven to rotate around a rotation axis 5-R relative to the fixed portion 5-100.

According to the structure of the elastic member 5-300, the rotation axis 5-R will pass through the axis section 5-350 of the elastic member 5-300. It should be noted that, in this embodiment, the rotation axis 5-R does not pass through the turning point of the light 5-L.

Due to the rotation of the optical member 5-30, the position of the light 5-L reaching the image sensor module 5-S can be slightly adjusted, and the purpose of focus adjustment can be achieved.

In some embodiments, the first electromagnetic driving member 5-410 is a magnet, and the second electromagnetic driving member 5-420 is a coil.

The position sensor 5-430 is disposed on the fixed portion 5-100 and corresponds to the second electromagnetic driving member 5-420. The position sensor 5-430 is configured to detect the position of the second electromagnetic driving member 5-420, so as to obtain the rotation angle of the movable portion 5-200 relative to the fixed portion 5-100. For example, the position sensor 5-430 can be a Hall sensor, a magnetoresistance effect sensor (MR sensor), a giant magnetoresistance effect sensor (GMR sensor), a tunneling magnetoresistance effect sensor (TMR sensor), or a fluxgate sensor.

Figure 9:
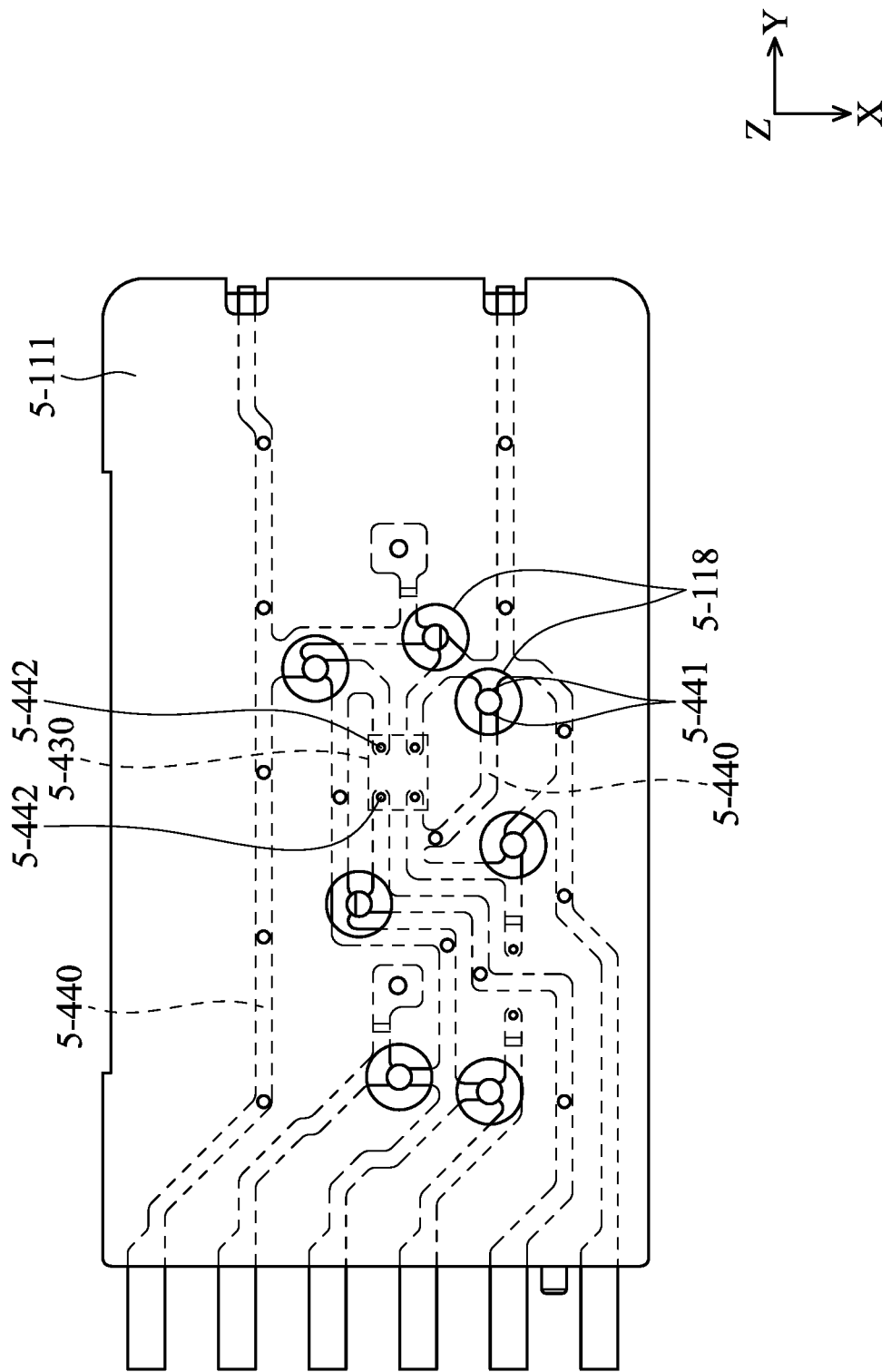
FIG. 9 is a bottom view of the optical member driving mechanism according to an embodiment of the invention.

The wires 5-440 can be embedded in the base 5-110 of the fixed portion 5-100, and can be connected to the first electromagnetic driving member 5-410 and the position sensor 5-430. As shown in FIG. 9, specifically, a plurality of through holes 5-118 are formed on the bottom 5-111, at least a portion of wires 5-440 is exposed from the through holes 5-118, and the interrupt region 5-441 of the wires 5-440 is also exposed from the through hole 5-118. The interrupt region 5-441 can be formed by drilling, therefore, the interrupt region 5-441 can include an arc profile.

The connecting portions 5-442 between the wires 5-440 and the position sensor 5-430 is symmetrical relative to the position sensor 5-430. Thus, the movement of the position sensor 5-430 due to the attachment of the solder in welding can be prevented.

As shown in FIG. 5, the magnetic permeability member 5-500 is disposed on the movable portion 5-200 and disposed between the movable portion 5-200 and the second electromagnetic driving member 5-420. The magnetic permeability member 5-500 is configured to enhance the electromagnetic pushing force. Moreover, the magnetic permeability member 5-500 includes at least one extending portion 5-510 extending through the movable portion 5-200 to increase the mechanical strength of the optical member driving mechanism 5-10.

Referring to FIGS. 5 and 8, the damping members 5-600 are disposed on the corners of the optical member driving mechanism 5-10 having a polygonal structure (a rectangular in this embodiment). For example, the damping members 5-600 can be connected to the fixed portion 5-100 and the movable portion 5-200, or disposed on the elastic member 5-300, so as to suppress the vibration during the rotation of the movable portion 5-200. The damping members 5-600 can be disposed on a virtual plane 5-P to increase the stability of the optical member driving mechanism 5-10, wherein the virtual plane 5-P is perpendicular to the incident direction 5-D1 of the light 5-L.

Figure 10:
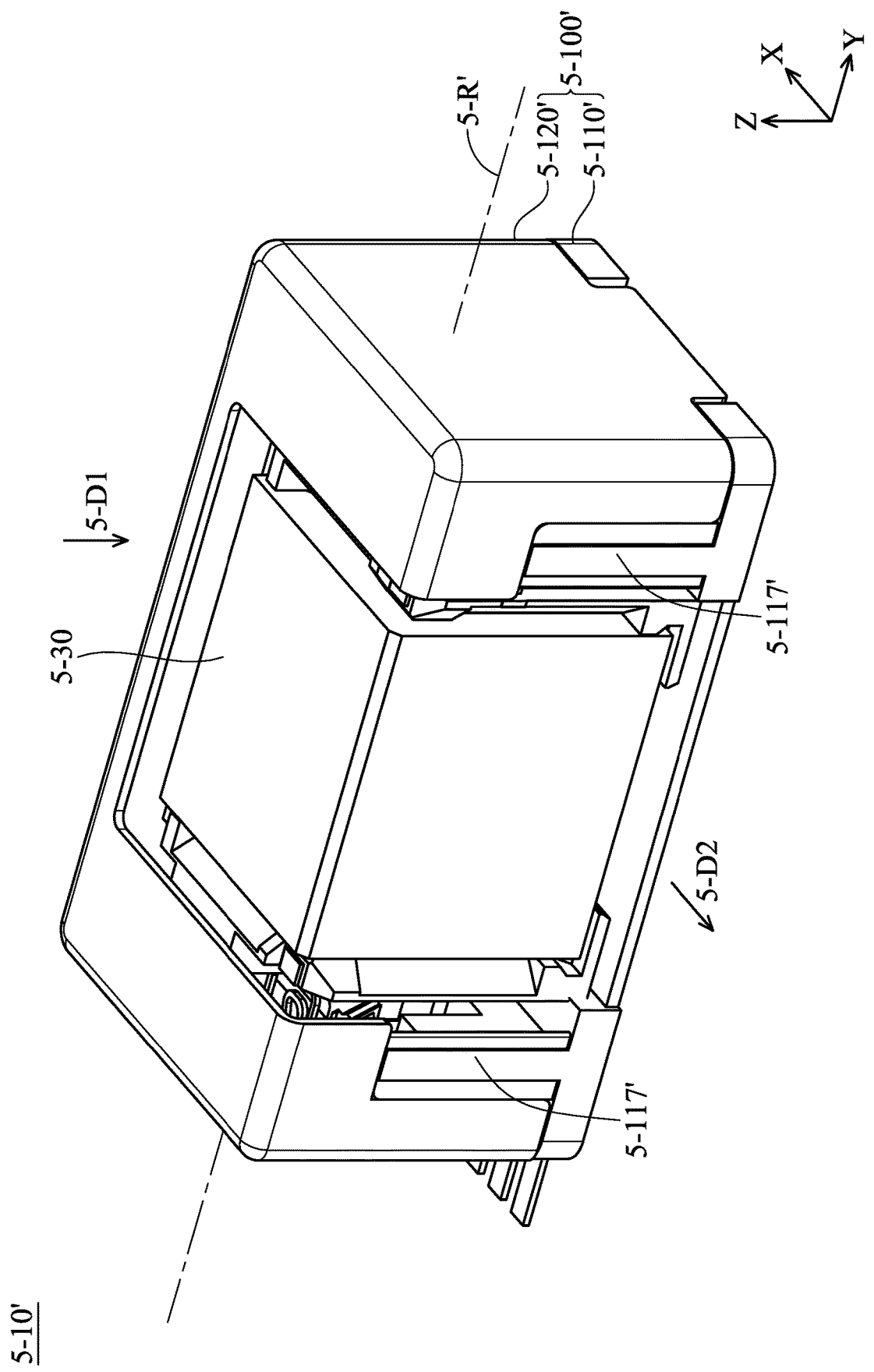
FIG. 10 is a schematic diagram of an optical member driving mechanism according to another embodiment of the invention.
Figure 11:
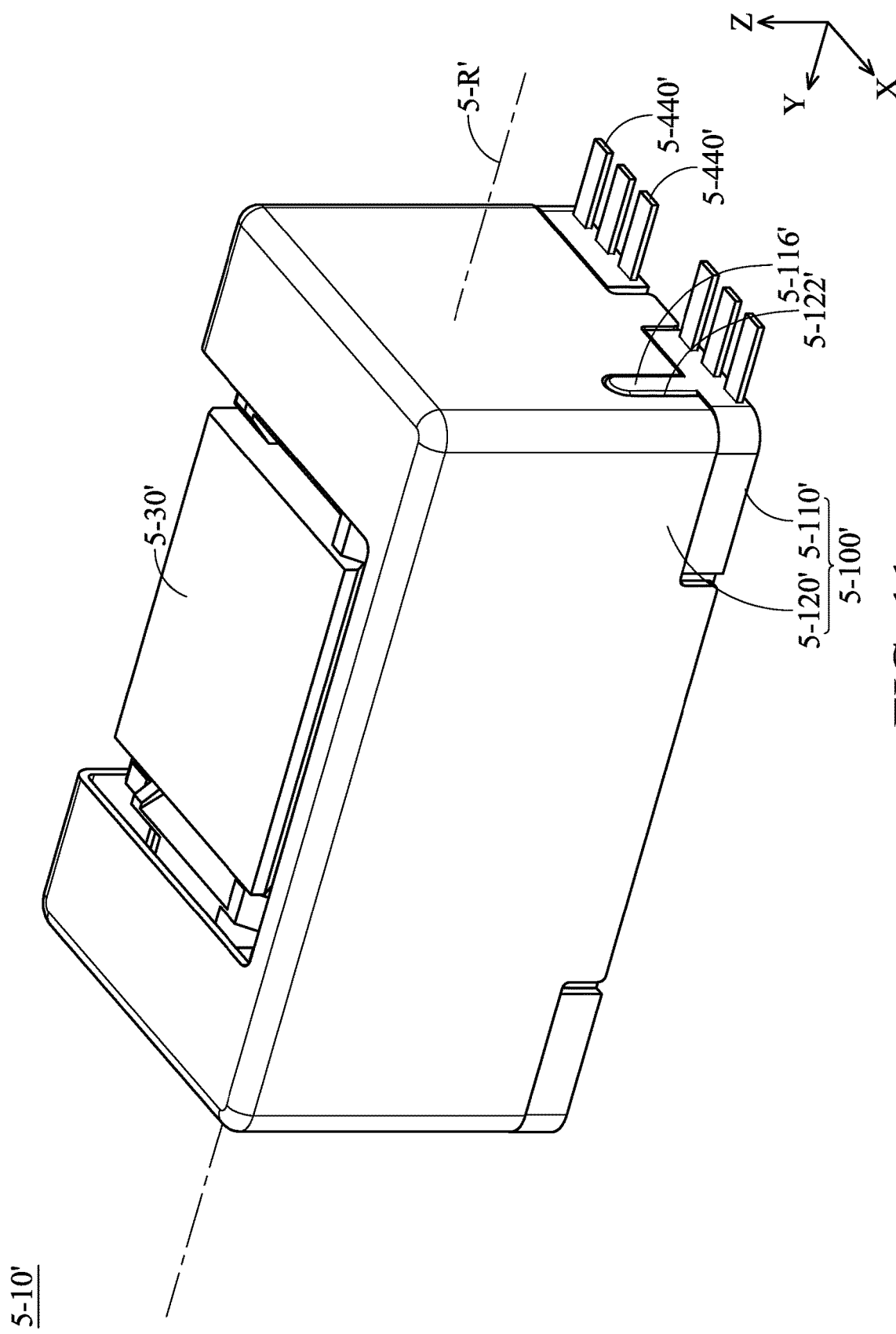
FIG. 11 is a schematic diagram of an optical member driving mechanism in another view according to another embodiment of the invention.
Figure 12:
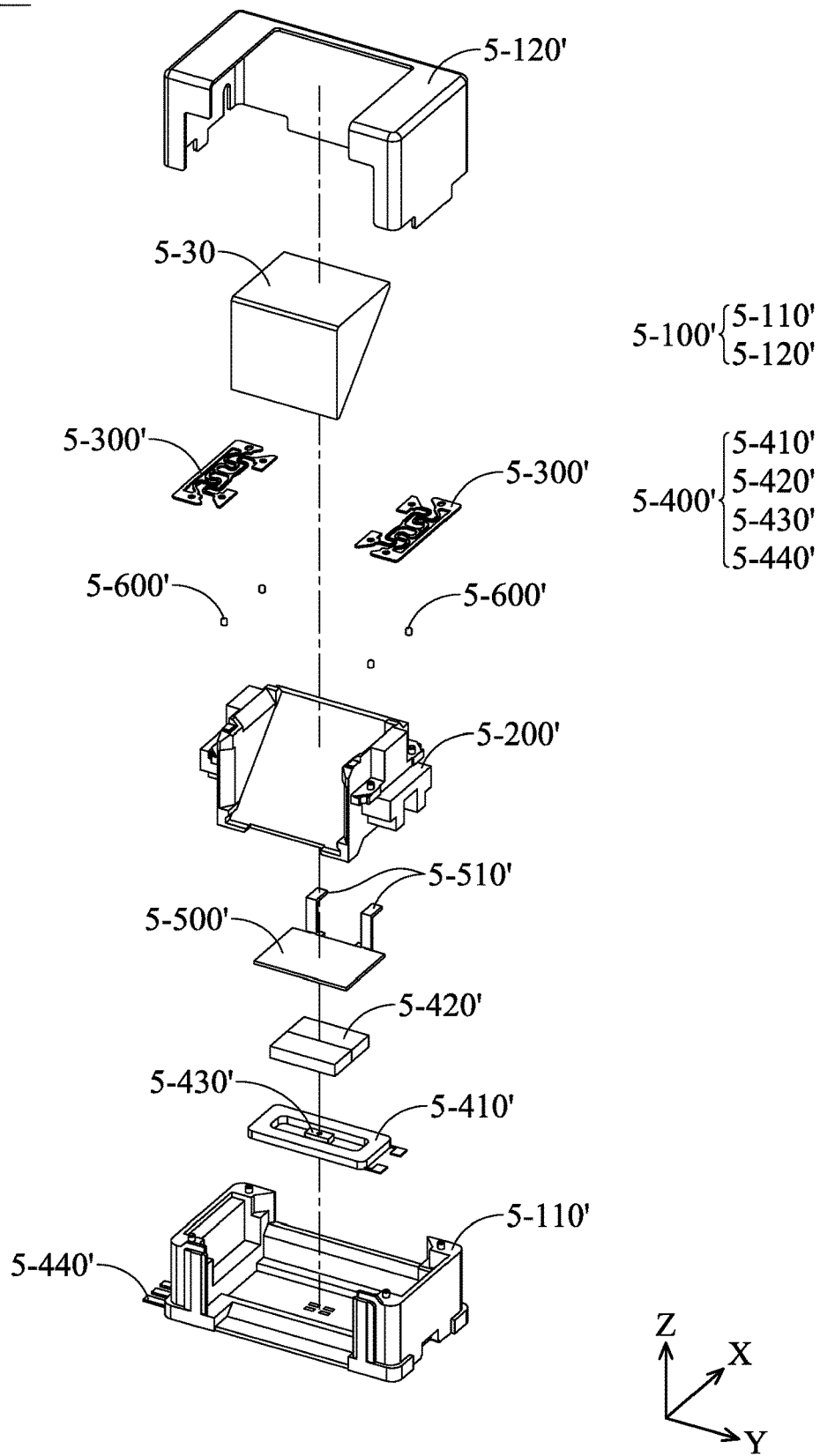
FIG. 12 is an exploded-view diagram of the optical member driving mechanism according to another embodiment of the invention.

Referring to FIGS. 10-12, in another embodiment, the optical member driving mechanism 5-10' includes a fixed portion 5-100', a movable portion 5-200', a plurality of elastic members 5-300', a driving assembly 5-400', at least one magnetic permeability member 5-500', and a plurality of damping members 5-600'.

The fixed portion 5-100' includes a base 5-110' and a housing 5-120'. The base 5-110' and the housing 5-120' can be assembled using snap-fit joints or adhesive member. Moreover, in order to ensure that the user assembles the base 5-110' and the housing 5-120' correctly, the base 5-110' has a positioning member 5-116' that protrudes from the lateral wall 5-112', and the housing 5-120' has a positioning slot 5-122' that corresponds to the positioning member 5-116'. When the base 5-110' is joined to the housing 5-120', the positioning member 5-116' enters the positioning slot 5-122'.

In this embodiment, the base 5-110' has a plurality of abutting members 5-117' protruding from the lateral wall 5-112' and facing the optical system 5-40. The surfaces of these abutting members 5-117' facing the optical system 5-40 are coplanar, so that the optical member driving mechanism 5-10 can horizontally attach the optical system 5-40.

Figure 13:
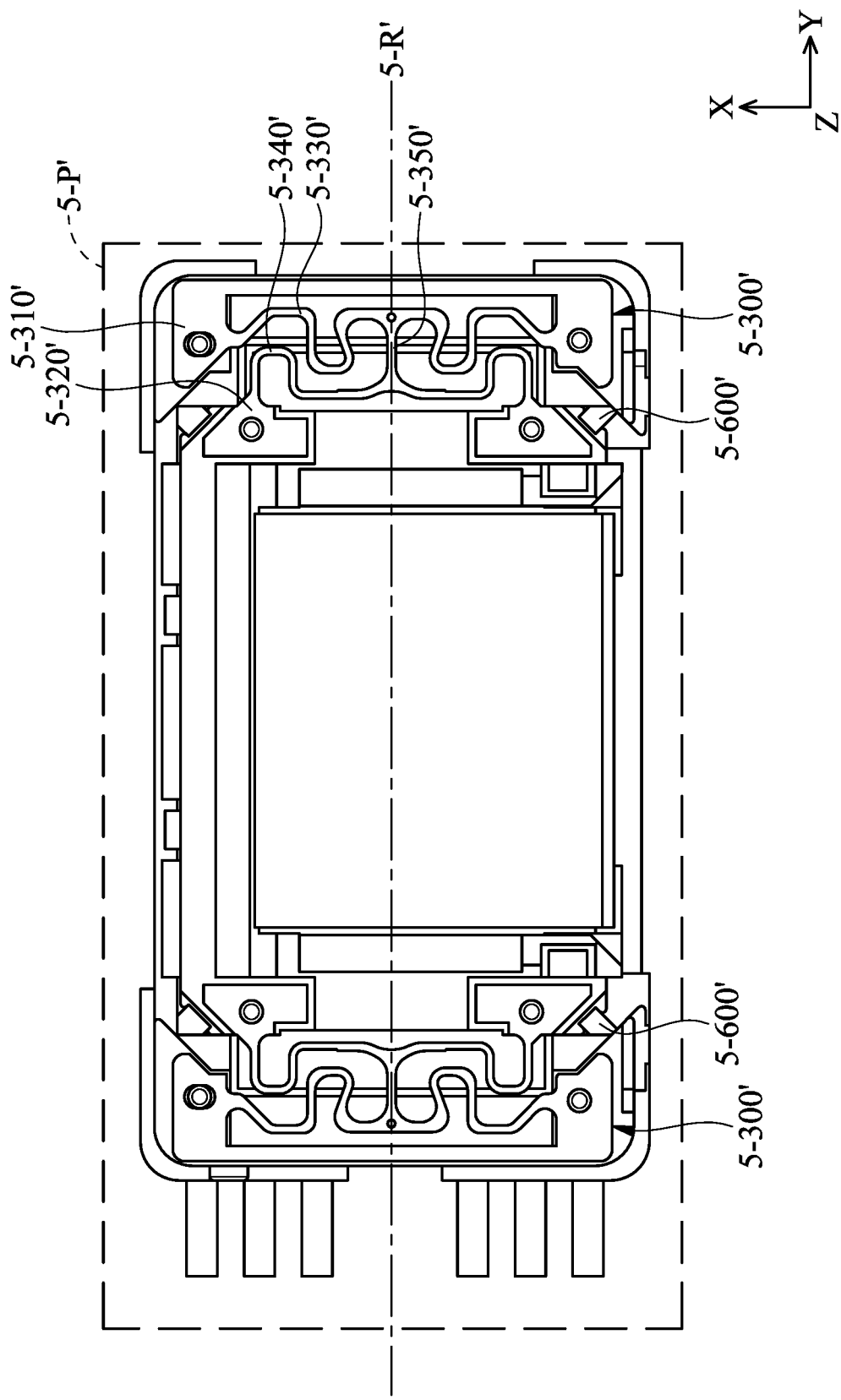
FIG. 13 is a top view of the optical member driving mechanism according to another embodiment of the invention, wherein the housing is omitted.

The movable portion 5-200' is an optical member holder, and the optical member 5-30 is disposed on the movable portion 5-200'. As shown in FIG. 13, each of the elastic member 5-300' has at least one first engaged section 5-310', at least one second engaged section 5-320', at least one first curved section 5-330', at least one second curved section 5-340', and at least one axis section 5-350'. The first engaged section 5-310' is affixed to the fixed portion 5-100', and the second engaged section 5-320' is affixed to the movable portion 5-200'. The first curved section 5-330', the second curved section 5-340', and the axis section 5-350' are disposed between the first engaged section 5-310' and the second engaged section 5-320'. The first curved section 5-330' connects the first engaged section 5-310' to the axis section 5-350', and the second curved section 5-340' connects the second engaged section 5-320' to the axis section 5-350'. The movable portion 5-200' can be suspended on the fixed portion 5-100' by the elastic member 5-300'.

Specifically, at least a portion of the first curved section 5-330' and the second curved section 5-340' overlap as seen from the outgoing direction 5-D2, so as to effectively distribute the stress during the rotation of the movable portion 5-200'.

As shown in FIG. 12, the driving assembly 5-400' includes at least one first electromagnetic driving member 5-410', at least one electromagnetic driving member 5-420', a position sensor 5-430', and a plurality of wires 5-440'. The first electromagnetic driving member 5-410' and the second electromagnetic driving member 5-420' are respectively affixed to the fixed portion 5-100' and the movable portion 5-200', and the position of the first electromagnetic driving member 5-410' corresponds to the position of the second electromagnetic driving member 5-420'. In this embodiment, the first electromagnetic driving member 5-410' is a coil, and the second electromagnetic driving member 5-420' is a magnet. When current flows through the first electromagnetic driving member 5-410', an electromagnetic effect is generated between the first electromagnetic driving member 5-410' and the second electromagnetic driving member 5-420', and the movable portion 5-200' and the optical member 5-30 disposed on the movable portion 5-200' are driven to rotate around a rotation axis 5-R' relative to the fixed portion 5-100'.

According to the structure of the elastic member 5-300', the rotation axis 5-R' will pass through the axis section 5-350' of the elastic member 5-300'. It should be noted that, in this embodiment, the rotation axis 5-R' does not pass through the turning point of the light 5-L.

Due to the rotation of the optical member 5-30, the position of the light 5-L reaching the image sensor module 5-S can be slightly adjusted, and the purpose of focus adjustment can be achieved.

In some embodiments, the first electromagnetic driving member 5-410' is a magnet, and the second electromagnetic driving member 5-420' is a coil.

The position sensor 5-430' is disposed on the fixed portion 5-100' and corresponds to the second electromagnetic driving member 5-420'. The position sensor 5-430' is configured to detect the position of the second electromagnetic driving member 5-420', so as to obtain the rotation angle of the movable portion 5-200' relative to the fixed portion 5-100'. For example, the position sensor 5-430' can be a Hall sensor, a magnetoresistance effect sensor (MR sensor), a giant magnetoresistance effect sensor (GMR sensor), a tunneling magnetoresistance effect sensor (TMR sensor), or a fluxgate sensor.

Figure 15:
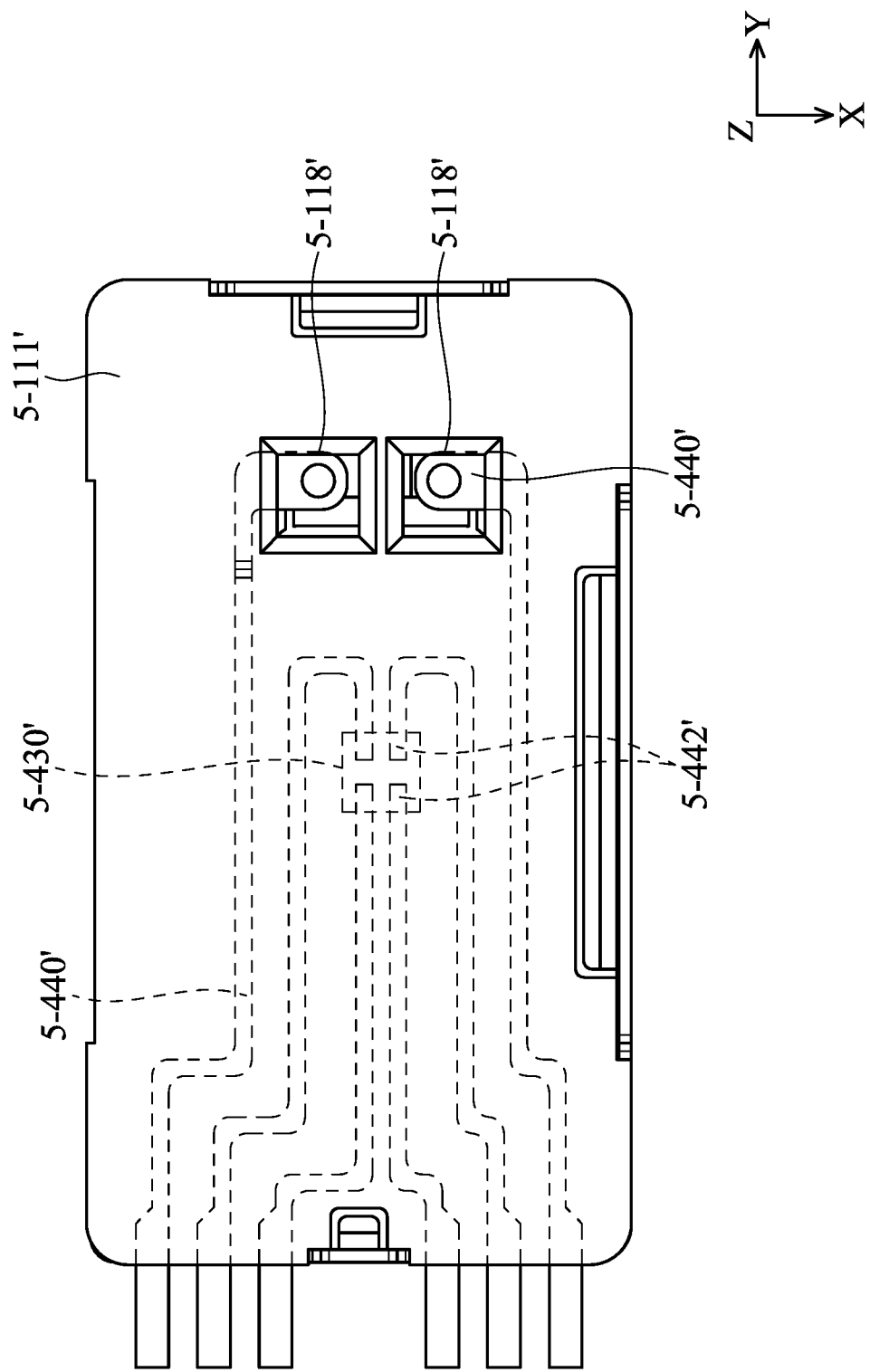
FIG. 15 is a bottom view of the optical member driving mechanism according to an embodiment of the invention.

The wires 5-440' can be embedded in the base 5-110' of the fixed portion 5-100', and can be connected to the first electromagnetic driving member 5-410' and the position sensor 5-430'. As shown in FIG. 15, specifically, a plurality of through holes 5-118' are formed on the bottom 5-111', and the user can weld the wires 5-440' to the first electromagnetic driving member 5-410' through the through hole 5-118'. In some embodiments, the wires 5-440' can be mounted by using surface-mount technology (SMT), and there is no need to form the through hole on the bottom 5-111'. The base 5-110' can achieve an integrated appearance.

Furthermore, the connecting portions 5-442' between the wires 5-440' and the position sensor 5-430' is symmetrical relative to the position sensor 5-430'. Thus, the movement of the position sensor 5-430' due to the attachment of the solder in welding can be prevented.

Figure 14:
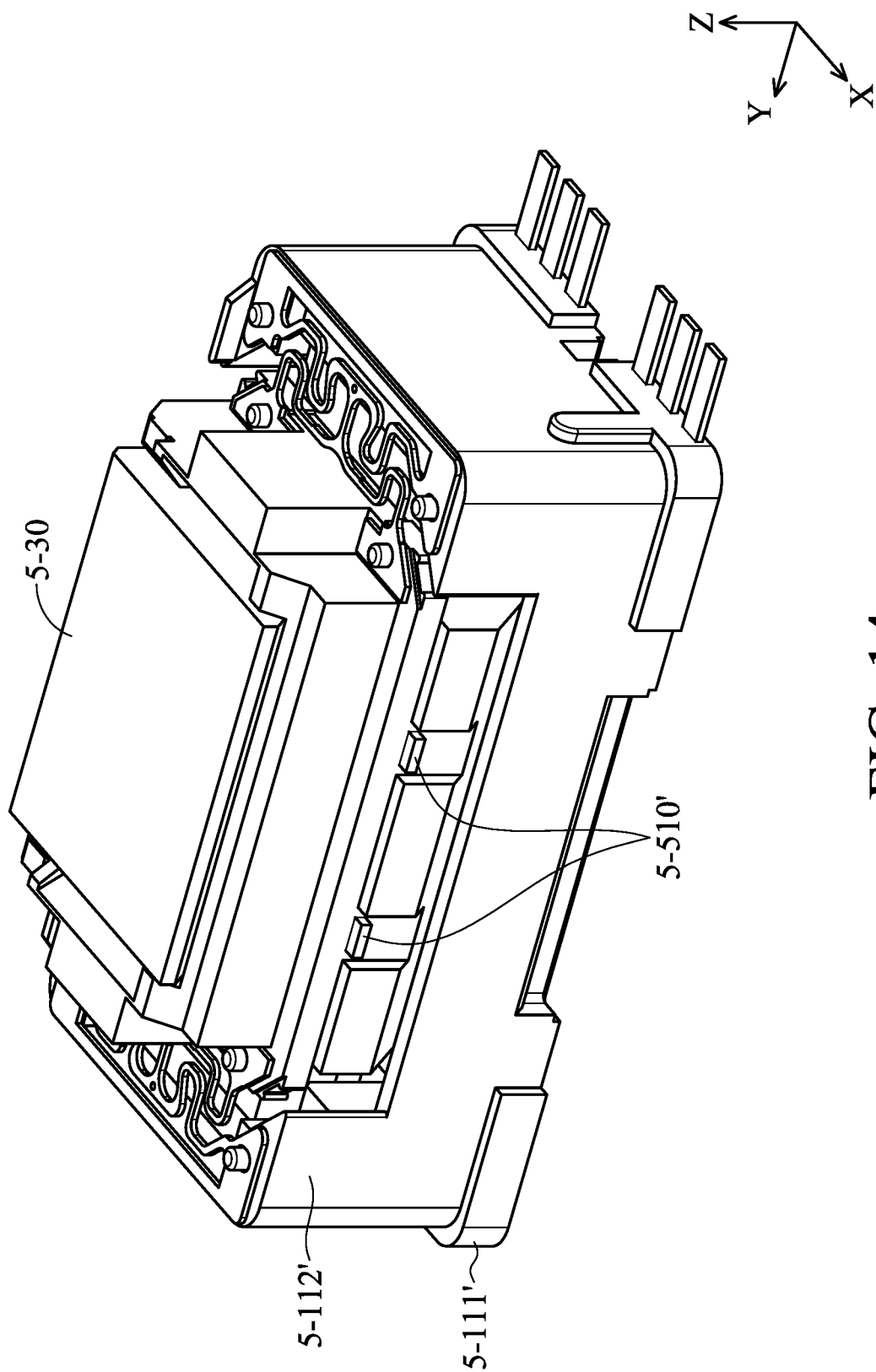
FIG. 14 is a schematic diagram of the optical member driving mechanism according to another embodiment of the invention, wherein the housing is omitted.

As shown in FIGS. 12 and 14, the magnetic permeability member 5-500' is disposed on the movable portion 5-200' and disposed between the movable portion 5-200' and the second electromagnetic driving member 5-420'. The magnetic permeability member 5-500' is configured to enhance the electromagnetic pushing force. Moreover, the magnetic permeability member 5-500' includes at least one extending portion 5-510' extending through the movable portion 5-200' to increase the mechanical strength of the optical member driving mechanism 5-10'. In this embodiment, the extending portion 5-510' extends to the back side of the optical member driving mechanism 5-10'.

As shown in FIG. 13, the damping members 5-600' are disposed on the corners of the optical member driving mechanism 5-10' having a polygonal structure (a rectangular in this embodiment). For example, the damping members 5-600' can be connected to the fixed portion 5-100' and the movable portion 5-200', or disposed on the elastic member 5-300', so as to suppress the vibration during the rotation of the movable portion 5-200'. The damping members 5-600' can be disposed on the a virtual plane 5-P' to increase the stability of the optical member driving mechanism 5-10', wherein the virtual plane 5-P' is perpendicular to the incident direction 5-D1 of the light 5-L.

In summary, an optical member driving mechanism is provided, including a movable portion, a fixed portion, and a driving assembly. The movable portion is connected to an optical member. The movable portion is movable relative to the fixed portion. The driving assembly is configured to drive the movable portion to move relative to the fixed portion.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. An optical member driving mechanism, comprising:
   a movable portion, connected to an optical member;
   a fixed portion, wherein the movable portion is movable relative to the fixed portion;
   a driving assembly, configured to drive the movable portion to move relative to the fixed portion;
   an elastic member, wherein the movable portion is movably connected to the fixed portion by the elastic member; and
   a plurality of damping members, configured to suppress the vibration of the movable portion relative to the fixed portion and disposed on the fixed portion, the movable portion or the elastic member,
   wherein the optical member is configured to adjust a emission direction of light from an incident direction to an outgoing direction, and the driving assembly is configured to drive the movable portion to rotate around a rotation axis relative to the fixed portion,
   wherein the optical member driving mechanism has a polygonal structure, and the damping members are disposed on the different corners as seen from the incident direction or the outgoing direction.

2. The optical member driving mechanism as claimed in claim 1, wherein the rotation axis does not pass through the turning point of the light.

3. The optical member driving mechanism as claimed in claim 1, wherein the fixed portion has a first side and a second side, the movable portion is disposed between the first side and the second side, and the elastic member extends from the first side to the second side.

4. The optical member driving mechanism as claimed in claim 1, wherein the elastic member has a plate structure, and the extending direction of the elastic member is perpendicular or parallel to the incident direction.

5. The optical member driving mechanism as claimed in claim 1, wherein the elastic member comprises:
   a first engaged section, connected to the fixed portion;
   a second engaged section, connected to the movable portion;
   a first curved section, connected to the first engaged section;
   a second curved section, connected to the second engaged section; and
   an axis section, connected to the first curved section and the second curved section, wherein at least a portion of the first engaged section and the second engaged section overlap as seen from the outgoing direction.

6. The optical member driving mechanism as claimed in claim 1, wherein the damping members are disposed on a virtual plane, and the virtual plane is perpendicular or parallel to the incident direction.

7. The optical member driving mechanism as claimed in claim 1, wherein a gap is formed between the optical member and the movable portion.

8. An optical member driving mechanism, comprising:
   a movable portion, connected to an optical member;
   a fixed portion, wherein the movable portion is movable relative to the fixed portion; and
   a driving assembly, configured to drive the movable portion to move relative to the fixed portion and comprising:
      a first electromagnetic driving member, disposed on the fixed portion;
      a second electromagnetic driving member, disposed on the movable portion and corresponding to the first electromagnetic driving member;
      a plurality of wires, embedded in the fixed portion; and
      a position sensor, connected to connecting portions of the wires,
   wherein the optical member is configured to adjust a emission direction of light from an incident direction to an outgoing direction, and the driving assembly is configured to drive the movable portion to rotate around a rotation axis relative to the fixed portion.

9. The optical member driving mechanism as claimed in claim 8, wherein the driving assembly further comprises a magnetic permeability member, disposed on the movable portion and between the second electromagnetic driving member and the movable portion.

10. The optical member driving mechanism as claimed in claim 9, wherein the magnetic permeability member has at least one extending portion that extends through the movable portion.

11. The optical member driving mechanism as claimed in claim 8, wherein the connecting portions of the wires are symmetric relative to the position sensor.

12. An optical member driving mechanism, comprising:
   a movable portion, connected to an optical member;
   a fixed portion, wherein the movable portion is movable relative to the fixed portion, and the fixed portion comprises:
      a housing; and
      a base, wherein the movable portion is disposed between the base and the housing, and the base comprises:
         a bottom, having an overflow groove; and
         a lateral wall, connected to the bottom and having a glue recess communicated with the overflow groove, wherein when the base is joined to the housing, the glue recess is disposed between the base and the housing, and the overflow groove is exposed; and a driving assembly, configured to drive the movable portion to move relative to the fixed portion, wherein the optical member is configured to adjust a emission direction of light from an incident direction to an outgoing direction, and the driving assembly is configured to drive the movable portion to rotate around a rotation axis relative to the fixed portion.

13. The optical member driving mechanism as claimed in claim 12, wherein the base has a protrusion and the housing has a hole, wherein when the base is joined to the housing, the protrusion passes through the hole.

14. The optical member driving mechanism as claimed in claim 12, wherein the optical member driving mechanism further comprises a plurality of wires embedded in the base, and the base comprises a plurality of through holes, wherein at least a portion of the wires is exposed from the through hole.

15. The optical member driving mechanism as claimed in claim 14, wherein the wires have at least one interrupt region, and the interrupt region is exposed from the through hole.

* * * * *